US007020793B1

(12) United States Patent
Hsieh

(10) Patent No.: US 7,020,793 B1
(45) Date of Patent: Mar. 28, 2006

(54) CIRCUIT FOR ALIGNING SIGNAL WITH REFERENCE SIGNAL

(75) Inventor: Cheng-Hsiang Hsieh, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 589 days.

(21) Appl. No.: 10/355,572

(22) Filed: Jan. 31, 2003

(51) Int. Cl.
*H03L 7/06* (2006.01)

(52) U.S. Cl. ...................... 713/401; 713/400; 713/500; 713/501; 713/502; 713/503; 713/600

(58) Field of Classification Search ................ 713/400, 713/401, 500–503, 600
See application file for complete search history.

(56) References Cited

U.S. PATENT DOCUMENTS

| | | | | |
|---|---|---|---|---|
| 5,963,069 | A * | 10/1999 | Jefferson et al. | 327/158 |
| 6,114,914 | A * | 9/2000 | Mar | 331/16 |
| 6,411,142 | B1 * | 6/2002 | Abbasi et al. | 327/156 |
| 6,518,807 | B1 * | 2/2003 | Cho | 327/158 |
| 6,539,072 | B1 * | 3/2003 | Donnelly et al. | 375/371 |
| 6,586,977 | B1 * | 7/2003 | Yang et al. | 327/157 |
| 6,693,473 | B1 * | 2/2004 | Alexander et al. | 327/158 |
| 6,744,293 | B1 * | 6/2004 | Fu et al. | 327/158 |
| 6,765,419 | B1 * | 7/2004 | Alexander | 327/158 |
| 6,777,990 | B1 * | 8/2004 | Partsch et al. | 327/149 |
| 6,839,860 | B1 * | 1/2005 | Lin | 713/401 |
| 6,931,086 | B1 * | 8/2005 | Harrison | 375/374 |

* cited by examiner

*Primary Examiner*—A. Elamin
(74) *Attorney, Agent, or Firm*—Thelen Reid & Priest LLP

(57) ABSTRACT

A signal-aligning circuit includes a phase-adjusting circuit, a first control circuit, a second control circuit, and a tuning circuit. The first control circuit outputs a first voltage signal reflecting a phase difference between a first input signal (reference signal) and a second input signal (adjusted signal) and having a static phase offset due to asymmetries in the first control circuit. The second control circuit is a replica of the first control circuit, and receives the reference signal at two inputs thereof and outputs a second voltage signal reflecting the same static phase offset. The tuning circuit compares the first and second voltage signals and tunes a bias current in the first and second control circuits, whereby the static phase offsets of the first and the second control circuits becomes zero when the adjusted signal is phase-aligned with the reference signal in the steady state.

30 Claims, 7 Drawing Sheets

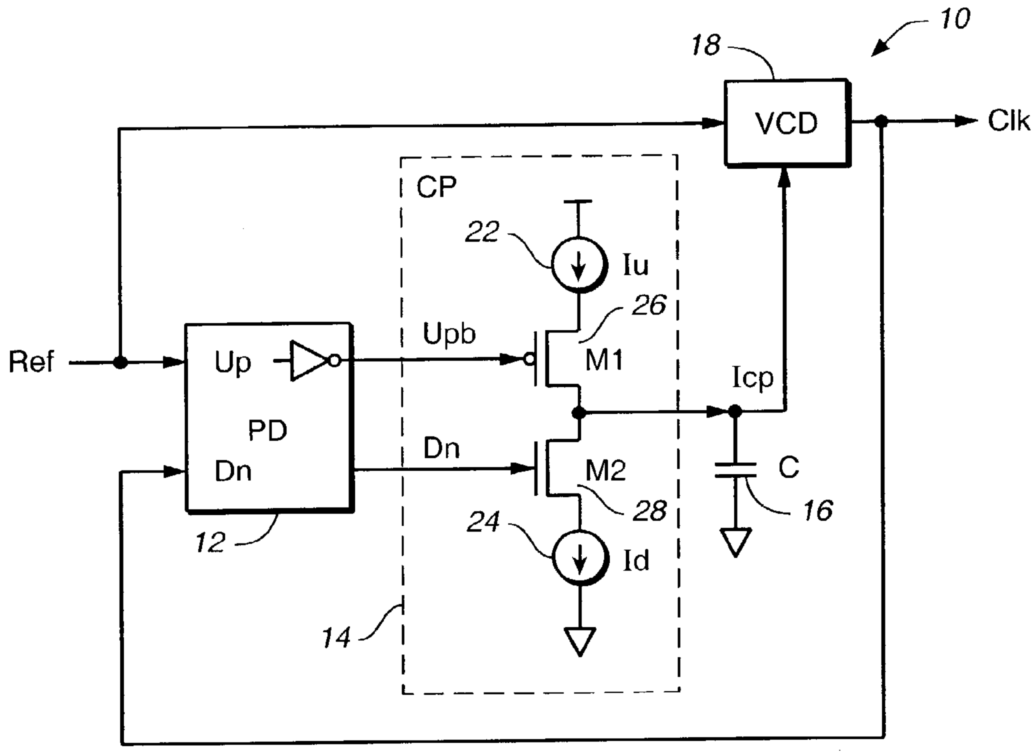
FIG._1 (PRIOR ART)
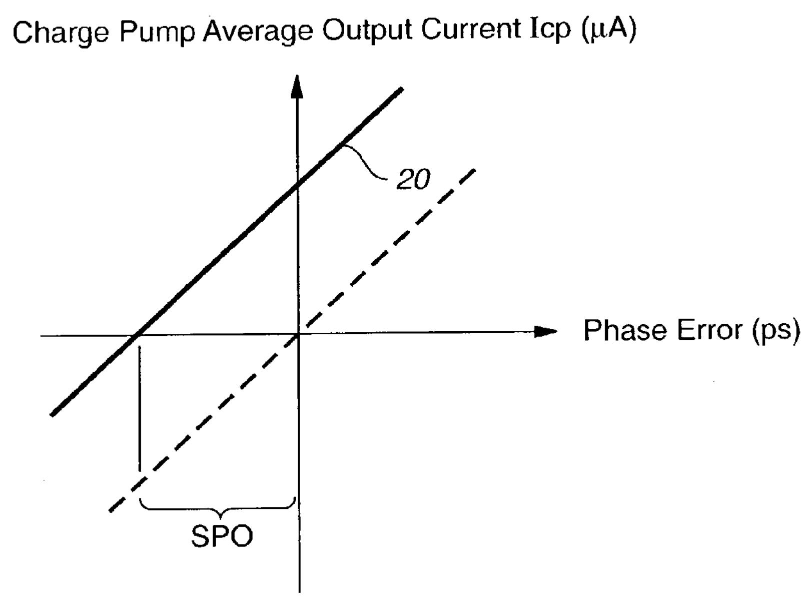
FIG._2 (PRIOR ART)

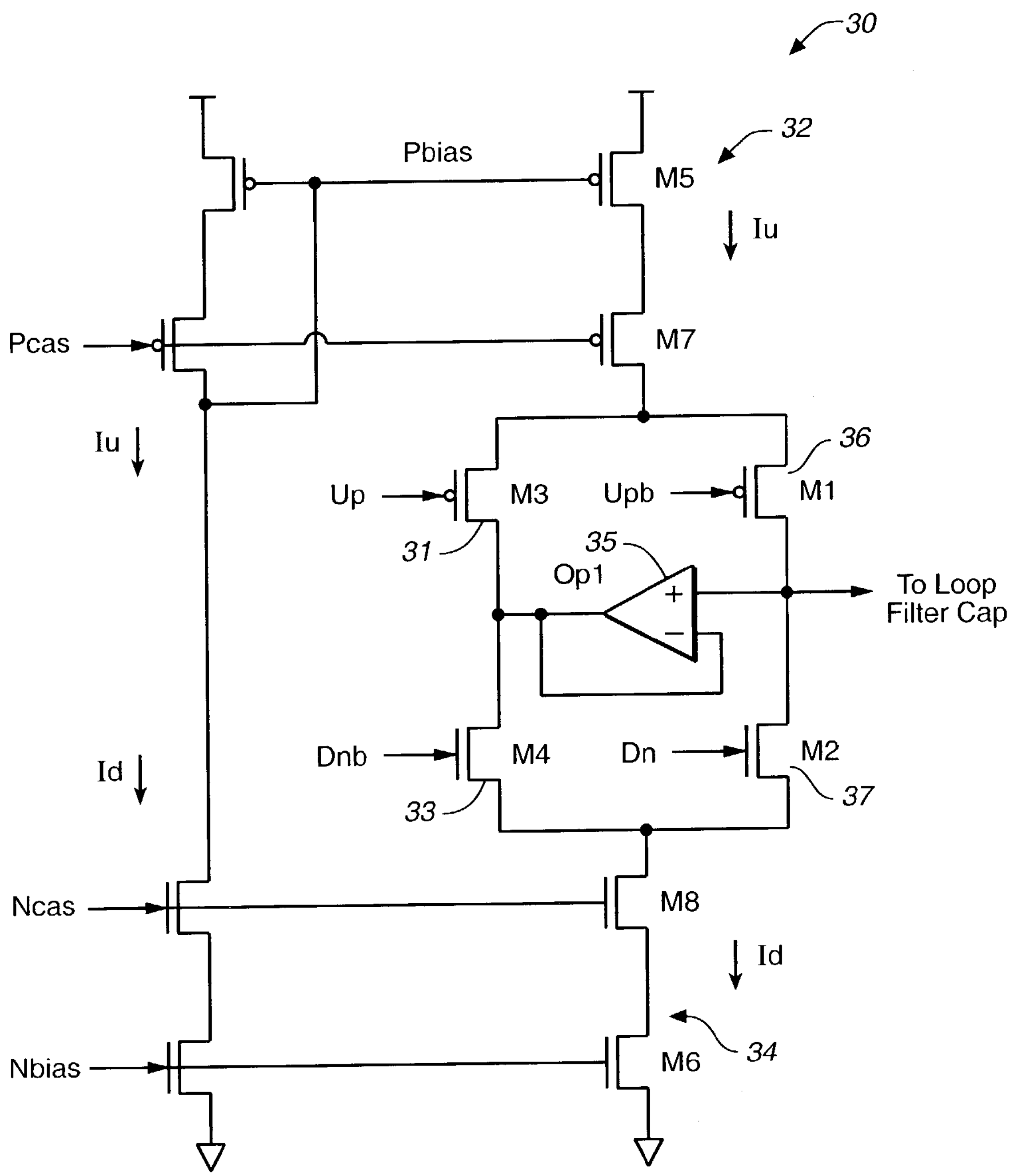
FIG._3 (PRIOR ART)

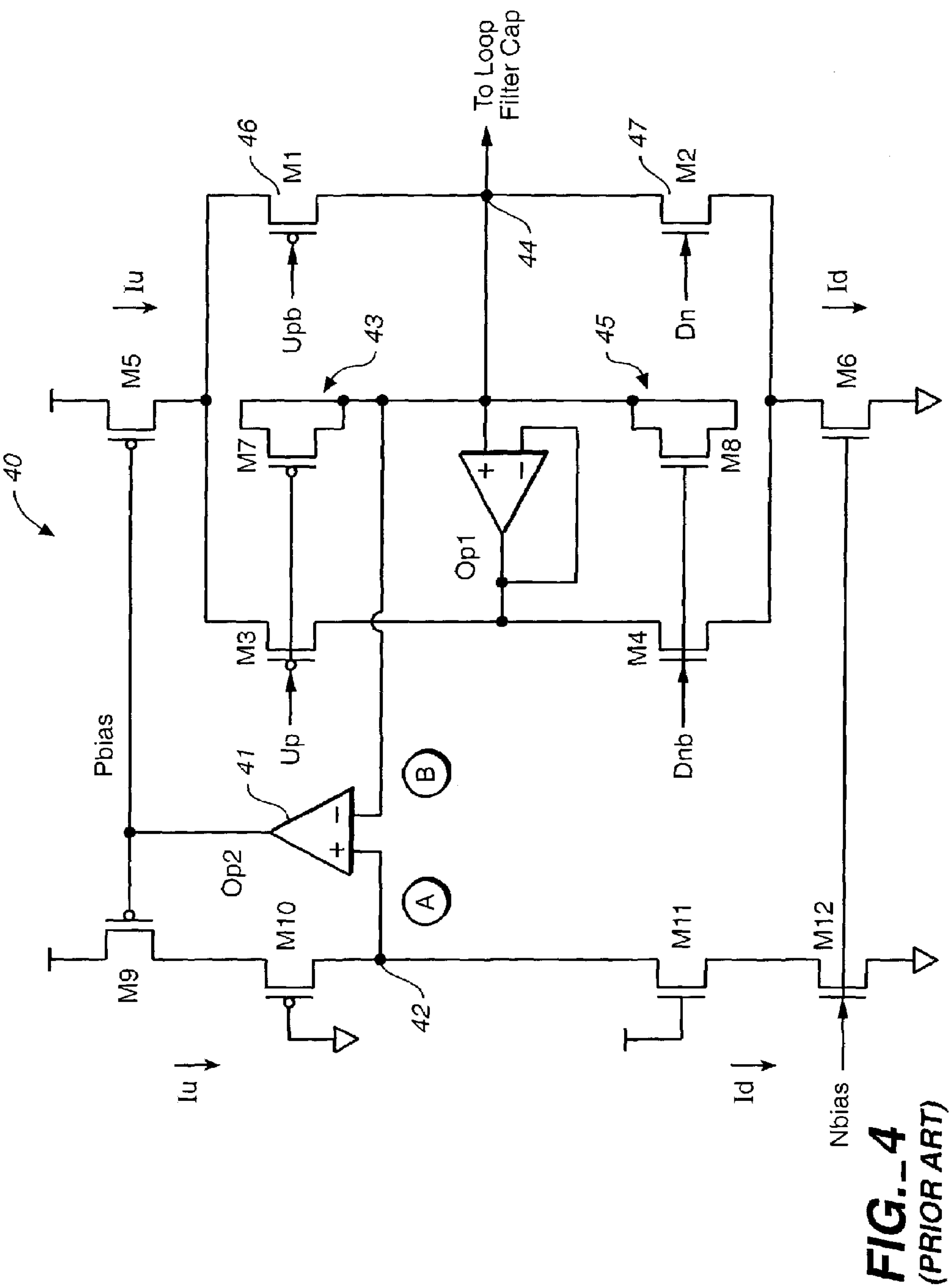
FIG._4
(PRIOR ART)

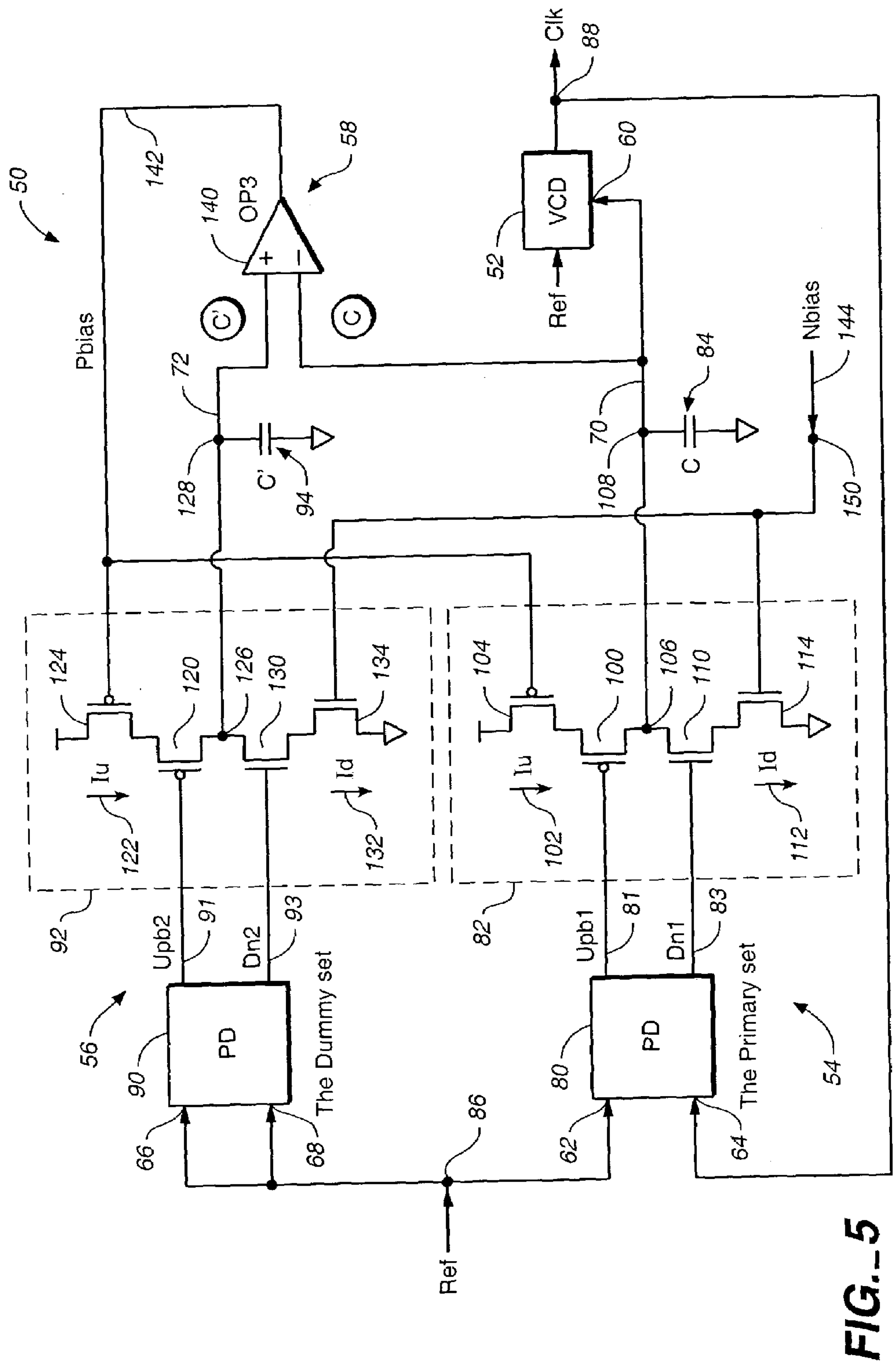
FIG._5

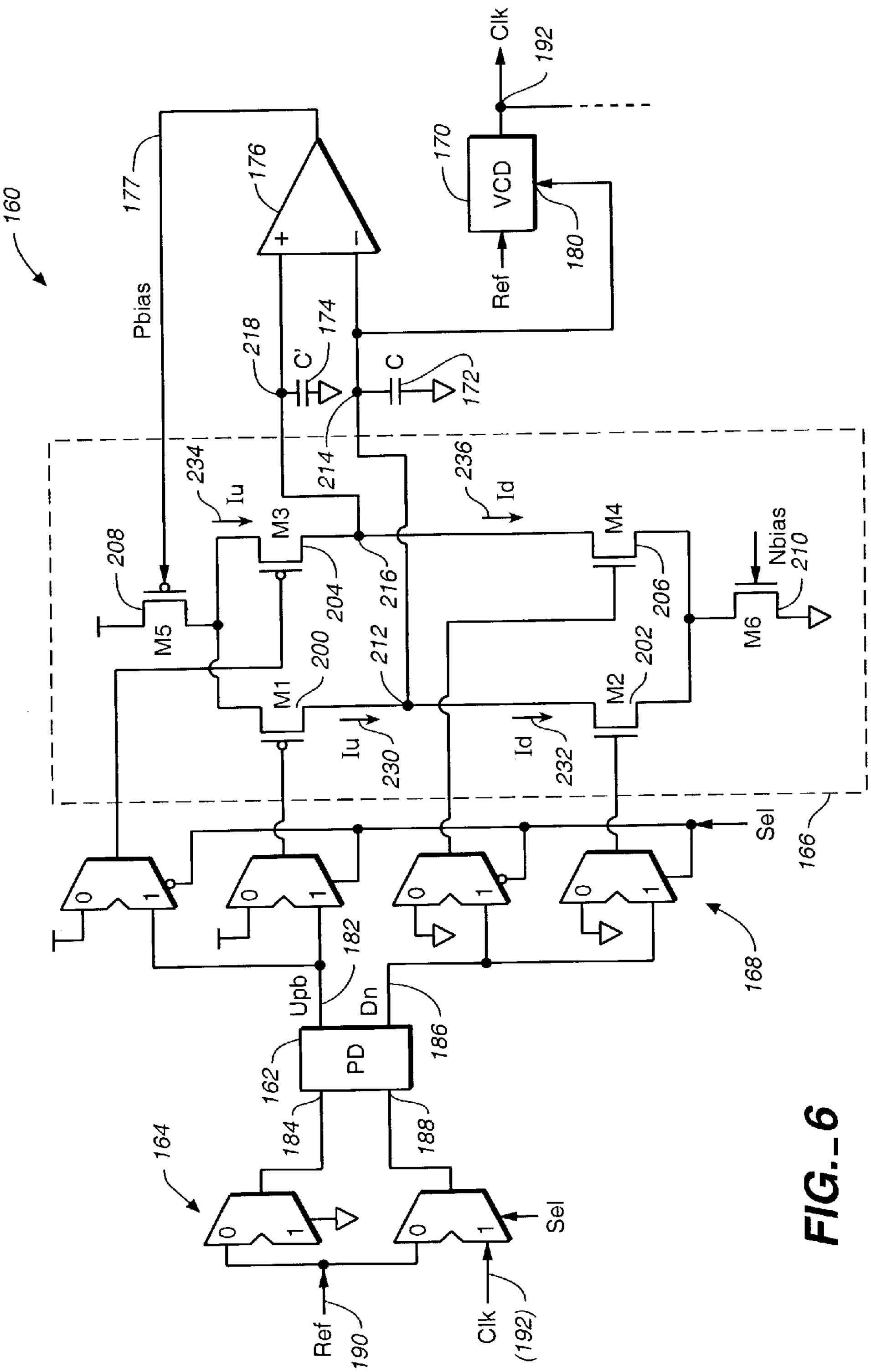
FIG._6

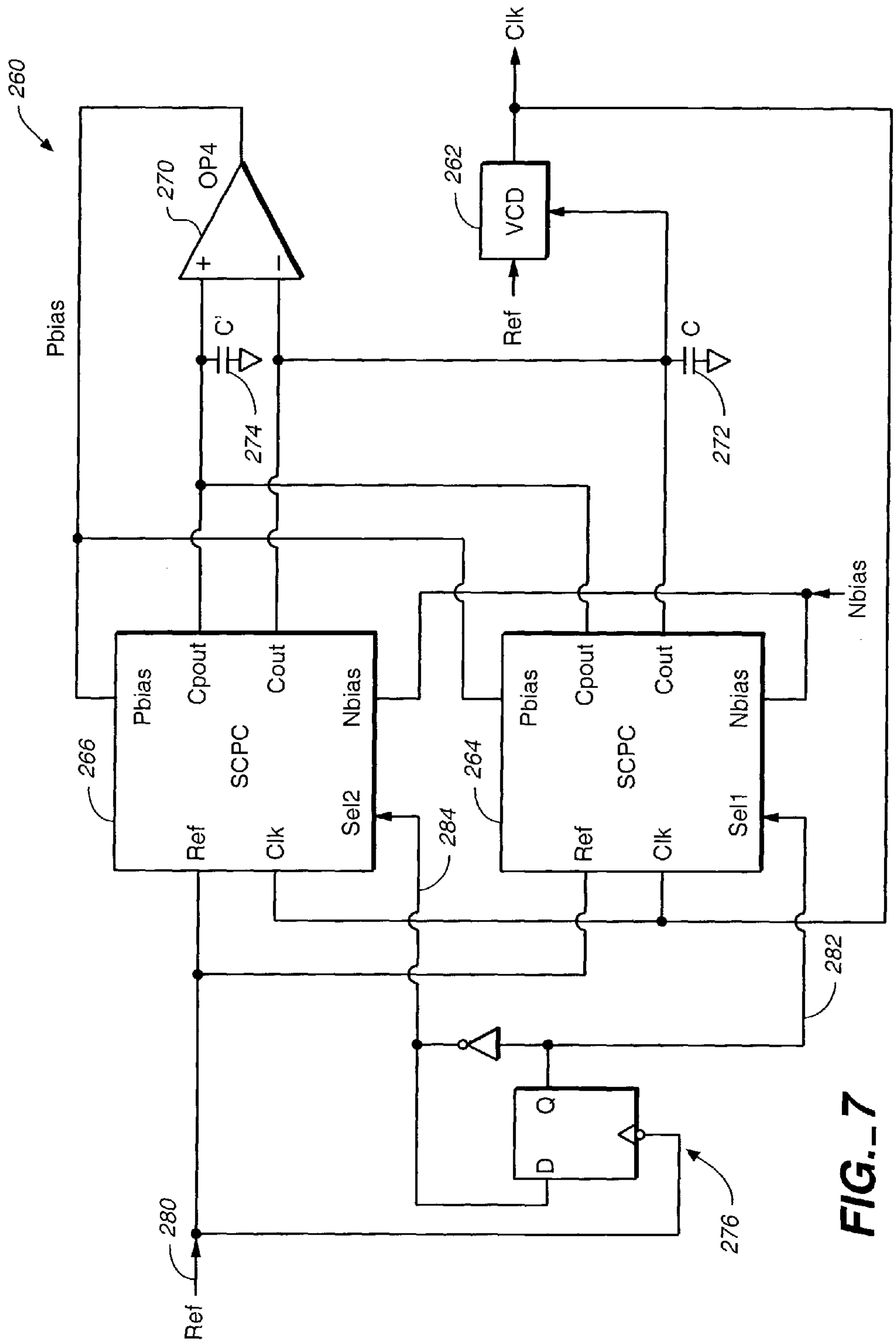
FIG._7

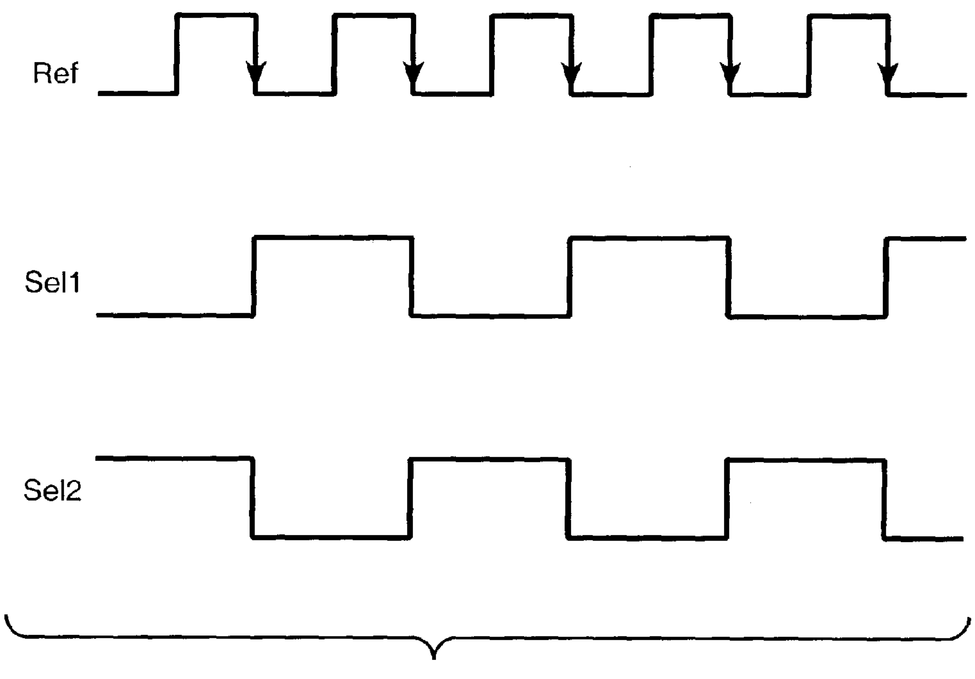
FIG._8

CIRCUIT FOR ALIGNING SIGNAL WITH REFERENCE SIGNAL

FIELD OF THE INVENTION

The present invention relates to integrated circuit designs. More particularly, the present invention relates to static phase-noise cancellation circuitry for a signal-aligning circuit.

BACKGROUND OF THE INVENTION

Analog Delay Lock Loops (DLL's) are commonly used in modern integrated circuits (IC's) to synthesize clock phases. FIG. 1 schematically illustrates a basic structure of a conventional analog DLL 10. The analog DLL 10 includes a phase detector (PD) 12, a charge pump circuit (CP) 14, a loop filter capacitor (C) 16, and a voltage-controlled-delay (VCD) 18. The DLL 10 locks the delay of the VCD to one reference cycle. The VCD output is typically a delayed clock signal (Clk). Thus, a rising edge of the delayed clock (Clk) is aligned with the next rising edge of the reference clock signal (Ref) in an ideal DLL. In an actual DLL, however, phase alignment between the delayed clock and the reference signal is subject to miscellaneous noises and other non-idealities.

The DLL performance is typically characterized by the statistical distribution of the delayed clock timing with respect to the reference signal. The spread of the distribution (measured in pico second) is referred to as jitter, and the mean of the distribution is referred to as static phase offset (SPO). Both jitter and SPO are key performance parameters of a DLL. Jitter is contributed by many noises and interference sources of the DLL, while static phase offset is contributed by the fixed asymmetry or mismatch in the phase detector and the charge pump circuit. The static phase offset of a DLL is revealed on the combined transfer curve of its phase detector and charge pump circuit. FIG. 2 schematically illustrates the time-averaged charge pump output current ($I_{cp}$) as a function of the phase error seen by the phase detector. For an ideal DLL, the curve should pass through the origin as indicated by a broken line. That is, when the time-averaged output current of the charge pump circuit diminishes to zero in the lock-state, the phase error is also zero. However, as shown in FIG. 2, the actual curve 20 is shifted by the amount of the static phase offset (SPO).

As shown in FIG. 1, the charge pump circuit 14 includes two current sources 22 and 24, a first active device (M1) 26, and a second active device (M2) 28. The voltage of the loop filter capacitor 16 should be a constant in the steady state, and the mismatch between a pump-up current (Iu) and a pump-down current (Id) is one of the SPO sources. This means that the total electric charge supplied through the first active device 26 must be canceling out with the total electric charge supplied through the second active device 28 each cycle. Since the first active device 26 is controlled by a first signal (Upb) and the second active device 28 is controlled by a second signal (Dn), the electric charges through the first active device 26 each cycle is the pulse-width (Wu) of the first signal Ubp times the pump-up current (i.e, Wu×Iu), and that of the second active device 28 is the pulse-width (Wd) of the second signal Dn times the pump-down current (i.e., Wd×Id). Thus, the mismatch between the pump-up and -down currents Iu and Id (i.e., a non-zero SPO) leads to a pulse-width difference between the first and second signals Upb and Dn.

Another SPO source comes from the opposite polarities of the signals Upb and Dn. The phase detector 12 is designed to be completely symmetrical from its two inputs up to the internal signals Up and Dn. In other words, the circuit that sets the pulse width of the signal Up in accordance with the reference signal (Ref) is identical to the circuit that sets the pulse width of the signal Dn in accordance with the delayed signal (Clk). The charge pump circuit 14, however, is not symmetrical since the pump-up switch M1 (first active device 26) is a PMOS requiring a "low" to turn on, while the pump-down switch M2 (second active device 28) is a NMOS requiring a "high" to turn on. Thus, the signal Up in the phase detector 12 needs to be inverted (to be the signal Upb) to control the first active device 26. This polarity inversion breaks the circuit symmetry and therefore causes the SPO.

In addition, since the first and second active devices 26 and 28 are of the opposite types and different sizes, their gate-to-drain feed-through currents are also different when switching. Similarly to the up-down current mismatch (Iu-Id mismatch) mentioned above, the clock-feed-through (CFT) mismatch between the active devices 26 and 28 also contributes to the SPO. The static phase offsets due to the Iu-Id mismatch and the polarity inversion are referred to as the systematic SPO or circuit SPO. The systematic SPO can be traced back to the lack of schematic-level symmetry between the pump-up side and the pump-down side of the DLL. In addition to systematic SPO, there are also random SPO or process SPO, which are due to random variations of device parameters, such as threshold voltage, channel length, and the like, in the phase detector and the charge pump circuit.

One of the pump-up and pump-down currents is current-mirrored from the other to ensure that they will track over variations of process, voltage, and temperature (PVT). Since the mirroring accuracy directly affects the SPO, cascode techniques are commonly used to meet accuracy demands. FIG. 3 schematically illustrates a conventional charge pump circuit 30 using the cascode techniques. The charge pump circuit 30 includes cascode current sources 32 and 34 (devices M5, M7 and M6, M8). Active devices 31 and 33 (M3 and M4) and an operational amplifier 35 (OP1) form a current dumping path that keep the current flowing (through active devices M5–M8) during the time period when the active devices 36 and 37 (M1 and M2) are turned off. However, such cascode mirroring increases the voltage headroom requirements of the current sources. This is undesirable because the voltage range at the charge pump output determines the tuning range of the VCD and thus the working frequency range of the DLL. Particularly for DLL's using low power supply voltages, the Iu-Id matching often needs be done without sacrificing the CP output range.

FIG. 4 schematically illustrates a mirroring scheme 40 suitable for low voltage environments. An operational amplifier OP2 and a DC replica circuit (M9–M12) of the charge pump circuit adjust the pump-up current Iu to match with the pump-down current Id. Nodes 42 and 44 are virtually shorted by the operational amplifier 41 (OP2), since the nodes 42 and 44 are connected to the two inputs of the operational amplifier 41. Since all matching devices see the matched Vds bias on them, it has a mirroring accuracy comparable to that of a cascode design.

As shown in FIG. 4, the mirroring circuit 40 includes compensating capacitors 43 and 45 (M7 and M8). The impact of the clock-feed-through mismatch to the SPO is usually mitigated using the compensating capacitors 43 and 45 by introducing an opposite clock-feed-through current.

The opposite current at least partially cancels with the original clock-feed-through current in the active devices 46 and 46 (M1 and M2). The capacitor sizes are determined through circuit simulations, and thus overall effectiveness of the cancellation is subject to the accuracy of the device models used in simulations. In this approach, the capacitor sizes can be optimized only for a given process-voltage-temperature case at a given clock frequency, and thus the current cancellation using the compensating capacitors is limited. Furthermore, any of the conventional approaches of DLL designs does not provide a satisfactory solution to the SPO due to the polarity inversion.

BRIEF DESCRIPTION OF THE INVENTION

A signal-aligning circuit includes a phase-adjusting circuit, a first control circuit coupled to the phase-adjusting circuit, a second control circuit, and a tuning circuit coupled to the first and second control circuits. The first control circuit outputs a first voltage signal in accordance with a phase difference between a first input signal (reference signal) and a second input signal (adjusted signal). There is a static phase offset in the first voltage signal due to asymmetries in the first control circuit. The second control circuit is a replica of the first control circuit and has the same static phase offset as the first control circuit. The second control circuit receives the reference signal at two inputs thereof and outputs a second voltage signal reflecting the same static phase offset. The tuning circuit compares the first and second voltage signals and tunes a bias current in the first and second control circuits such that the static phase offsets of the first and the second control circuits become zero when the adjusted signal is phase-aligned with the reference signal in the steady state.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is an electrical block diagram schematically illustrating a basic structure of a conventional analog DLL.

FIG. 2 is a diagram schematically illustrating the time-averaged charge pump output current ($I_{cp}$) as a function of the phase error seen by the phase detector.

FIG. 3 is an electrical block diagram schematically illustrating a conventional charge pump circuit using the cascode techniques.

FIG. 4 is an electrical block diagram schematically illustrating a mirroring scheme in a conventional DLL suitable for low voltage environments.

FIG. 5 is an electrical block diagram schematically illustrating a circuit for aligning a signal with a reference signal in accordance with one embodiment of the present invention.

FIG. 6 is an electrical block diagram schematically illustrating a circuit for aligning a signal with a reference signal which including a self-calibrating PD-CP design in accordance with one embodiment of the present invention.

FIG. 7 is an electrical block diagram schematically illustrating a circuit for aligning a signal with a reference signal, in accordance with one embodiment of the present invention.

FIG. 8 is a timing diagram schematically illustrating waveforms of the reference signal and the first and second selection signals in accordance with the one embodiment of the present invention.

DETAILED DESCRIPTION

Embodiments of the present invention are described herein in the context of a circuit for aligning a signal with a reference signal. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 5 schematically illustrates a circuit 50 for aligning a signal with a reference signal in accordance with one embodiment of the present invention. The circuit 50 includes a phase-adjusting circuit 52, a first control circuit 54, a second control circuit 56, and a tuning circuit 58 coupled to the first and second control circuits 52 and 54. The phase-adjusting circuit 52 may be a voltage-controlled delay (VCD) where the circuit 50 is used in a delay-locked loop (DLL). The phase-adjusting circuit 52 may be a voltage-controlled oscillator (VCO) where the circuit 50 is used in a phase-locked loop (PLL). The phase-adjusting circuit 52 adjusts a phase of a signal (reference signal Ref) in accordance with a control signal received at a control signal input 60, and outputs an adjusted signal, for example, a delayed clock signal (Clk). Although the embodiments are described for a DLL in the following disclosure, the present invention is similarly applicable to a PLL.

The first control circuit 54 is coupled to the phase-adjusting circuit 52, and outputs a first voltage signal 70 in accordance with a phase difference between a first input signal 62 and a second input signal 64. The first control circuit 54 receives a reference signal (Ref) as the first input signal 62 and the adjusted signal (Clk) as the second input signal 64. The first control circuit 54 has a phase offset due to asymmetries in components (inner circuitry and active devices). The second control circuit 56 has a substantially identical structure as the first control circuit 54, as shown in FIG. 5. The second control circuit 56 is a replica of the first control circuit 54 and, therefore, the systematic static phase offset of the first control circuit 54 and that of the second control circuit 56 are the same. The second control circuit 56 receives the reference signal (Ref) as two input signals 66 and 68, and outputs a second voltage signal 72.

The tuning circuit 58 is coupled to the first and second control circuits 54 and 56. The tuning circuit 58 compares the first and second voltage signals 70 and 72, and adjusts the bias current in the first and second control circuits 54 and 56 such that, in the steady state, the systematic static phase offset will be zero for both of the first and second control circuits 54 and 56.

In accordance with one embodiment of the present invention, as shown in FIG. 5, the first control circuit 54 includes a first phase detector (PD) 80, a first charge pump circuit (CP) 82, and a first capacitor (C) 84. Similarly, the second control circuit 56 includes a second phase detector (PD) 90, a second charge pump circuit (CP) 92, and a second capacitor (C') 94.

The first phase detector 80 is coupled to a reference signal input node 86 and an output 88 of the phase-adjusting circuit 52. The first phase detector 80 receives the reference signal (Ref) and the adjusted signal (Clk) as its input signals 62 and 64, and outputs a first control signal (Upb1) 81 and a second control signal (Dn1) 83. The first control signal 81 has a pulse width corresponding to the first input signal 62 (reference signal Ref), and the second control signal 83 has a pulse width corresponding to the second input signal 64 (adjusted signal Clk).

The first charge pump circuit 82 is coupled to the first phase detector 80. The first charge pump circuit 82 includes a first active device 100 and a second active device 110. The first device 100 controls a first current (pump-up current Iu) 102 flowing from a first current source 104 to a first output node 106 in accordance with the first control signal 81. The second device 110 controls a second current (pump-down current Id) 112 flowing from the first output node 106 to a second current source 114 in accordance with the second control signal 83. The first output node 106 is coupled to a first capacitor node 108 to which the first capacitor 84 is coupled. The first capacitor node 106 is also coupled to the control input 60 of the phase-adjusting circuit 52, and provides the first voltage signal 70.

The second phase detector 90 is coupled to the reference signal input node 86. The second phase detector 90 receives the same reference signal (Ref) as its two input signals 66 and 68, and outputs a third control signal (Upb2) 91 and a fourth control signal (Dn2) 93. The third control signal 91 has a pulse width corresponding to the reference signal (Ref), and the fourth control signal 93 also has a pulse width corresponding to the reference signal (Ref).

The second charge pump circuit 92 is coupled to the second phase detector 90. The second charge pump circuit 92 includes a third device 120 and a fourth device 130. The third device 120 controls a third current (pump-up current Iu) 122 flowing from a third current source 124 to a second output node 126 in accordance with the third control signal 91. The fourth device 130 controls a fourth current (pump-down current Id) 132 flowing from the second output node 126 to a fourth current source 134 in accordance with the fourth control signal 93. The second output node 126 is coupled to a second capacitor node 128 to which the second capacitor 94 is coupled. The second capacitor 94 provides the second voltage signal 72. It should be noted that the current dumping paths (similar to that described above in FIG. 3) in the both charge pump circuits 82 and 92 are omitted from the FIG. 5 for clarity.

The tuning circuit 58 includes an operational amplifier (OP3) 140 coupled to the first and second capacitor nodes 108 and 128 and to the first and second charge pump circuits 82 and 92. An output signal (Pbias) 142 of the operational amplifier 140 controls the first and third current sources 104 and 124.

As shown in FIG. 5, the first and third devices 100 and 120 are typically PMOSFETs, and the second and fourth devices 110 and 130 are typically NMOSFETs. The first and third current sources 104 and 124 are PMSOFETs and controlled by a first bias voltage (Pbias) 142 supplied from the operational amplifier 140. The second and fourth current sources 114 and 134 are NMOSFETs and controlled by a second bias voltage (Nbias) 144 supplied from a bias node 150. In accordance with one embodiment of the present invention, the capacitance of the second capacitor 94 is smaller than a capacitance of the first capacitor 84. For example, the capacitance of the second capacitor 94 may be about ¼ of the capacitance of the first capacitor 84.

As described above, the two charge pump circuits 82 and 92 receive the same first and second bias signals (Pbias and Nbias) 142 and 144 that control their pump-up current Iu and pump-down current Id, respectively. Thus, the combined phase detector-charge pump (PD-CP) transfer curves of the two control circuits 54 and 56 are identical. The first control circuit 54 includes the primary PD-CP set (80 and 82) which works in the same manner as in a conventional DLL such as shown in FIG. 1. The primary set compares the adjusted signal (Clk) timing with the reference signal (Ref) timing, and drives the loop filter capacitor C (the first capacitor 84) so as to control the phase-adjusting circuit (VCD) 52. The output signal at the first output node 106 reflects the phase difference between the two input signals 62 and 64 (adjusted signal and the reference signal) as well as the static phase offset caused by all asymmetries in the circuitry up to the first output node 106.

The second control circuit 56 includes a secondary or "dummy" PD-CP set (90 and 92) which serves as a systematic SPO monitor since the both inputs 66 and 68 thereof are coupled to the same reference signal (Ref). The dummy set does not control the phase-adjusting circuit 52 but drives the second capacitor 94. The outputs of the first and second capacitors 84 and 94 are compared by the operational amplifier (OP3) 140 so as to fine-tunes the first bias voltage (Pbias) 142, controlling the pump-up currents 102 and 122 in both of the first and second charge pump circuits 82 and 92.

The capacitance of the second capacitor 94 is chosen to be about ¼ of the capacitance of the first capacitor 84. It should be noted that although a path from the first capacitor 84 to the operational amplifier 140 to the pump-up current Iu forms a positive feedback loop, the overall DP-DC scheme is still stable because the smaller capacitance of the second capacitor 94 allows another negative loop (the second capacitor 94 to the amplifier 140 to the pump-up current Iu) to response to perturbations much faster.

With both inputs 66 and 68 shorted to the reference signal (Ref) input node 86, the dummy set (phase detector 90 and charge pump 92) is actually a dynamic replica of the primary set (phase detector 80 and charge pump 82) under the perfect lock condition (i.e, the adjusted signal Clk is identical to the reference signal Ref). If the SPO is not zero, the second capacitor 94 is slowly charged up or down by the "dummy" charge pump 92, and, through the operational amplifier 140 and its output signal (Pbias) 142, the pump-up current Iu (the first and third current 102 and 122) is gradually adjusted to reduce the SPO. The pump-up current Iu settles to the value that gives zero overall systematic SPO under all PVT and clock frequency conditions.

Assuming that no random mismatches exist between the primary and dummy PD-CP sets, the same pump-up current Iu can be mirrored to the primary PD-CP set to lock the DLL with zero SPO. The operational amplifier 140 also establishes a virtual-short between the first and second capacitor nodes 108 and 128. Since the two capacitor nodes 108 and 128 are virtually shorted, all matching devices see the matched drain-source bias Vds thereon. Thus, high accuracy current-mirroring between the two charge pump circuits 82 and 92 can be achieved without cascading. In addition, because of the virtual-short of the capacitor nodes, the current switches in the both charge pump circuits 82 and 92 are operating under the same bias condition, so that their clock-feed-through currents track closely with each other.

As described above, the circuit 50 includes a full PD replica with zero phase error and a full CP replica running at the same frequency as the DLL. In accordance with the embodiment of the present invention, the circuit 50 cancels out not only the DC imbalance between the pump-up and pump-down currents Iu and Id, but also all other transient imbalance caused by the polarity inversion.

In accordance with one embodiment of the present invention, the dummy DP-CP set in the circuit 50 can be a scaled down version of the primary DP-CP set so as to save the power and area of the circuit. In addition, in the case where an IC chip includes multiple, schematic-wise identical DLL's, the systematic SPO cancellation circuitry (i.e., the dummy PD-CP set 90 and 92, the second capacitor 94, and the operational amplifier 140) can be shared by the multiple DLL's to save the power and area of the chip.

As described above, the total static phase offset (SPO) in a conventional DLL 10 (shown in FIG. 1) is the sum of the systematic SPO caused by the Iu-Id mismatch and polarity inversion, and the random SPO caused by the process variations in the current sources 22 and 24 and the current switches (M1, M2) 26 and 28 in the charge pump circuit 14, and variations between the up (Up) side and the down (Dn) side of the phase detector 12. Unlike the conventional DLL 10, in the double-DP double-CP DLL 50 (FIG. 5) has all the systematic SPO canceled out and sees only the random SPO.

However, a double-DP double-CP DLL may have more random SPO than that of a conventional DLL. For example, the double-DP double-CP DLL 50 has, on average, 41% more random SPO compared to that of its non-“double-DP double-CP” counterpart. This is because the effective random variations of a double-DP double-CP DLL are actually the random variations in its primary PD-CP set minus the random variations in its dummy PD-CP set. In other words, if the SPO of a DLL using the primary PD-CP set alone is a random variable x1 and that of a DLL using the dummy PD-CP set alone is a random variable x2, respectively, the SPO of a double-DP double-CP DLL using both sets is the random variable (x1−x2). As the variables x1 and x2 have the same standard deviation, σ, the standard deviation of x1−x2 is 1.41σ. However, this increased random variation can be mitigated by employing a self-calibrating PD-CP design for a double-DP double-CP DLL.

FIG. 6 schematically illustrates a circuit 160 for aligning a signal with a reference signal which including a self-calibrating PD-CP design in accordance with one embodiment of the present invention. As shown in FIG. 6, the circuit 160 includes a phase detector 162, a first selector circuit 164 for the phase detector 162, a charge pump circuit 166, a second selector circuit 168 for the charge pump circuit 166, a phase-adjusting circuit 170, a first capacitor 172, a second capacitor 174, and an operational amplifier 176.

The phase-adjusting circuit 170 outputs an adjusted signal (Clk) in accordance with a control signal supplied at a control input 180 thereof. The phase-adjusting circuit 170 may be a VCD or VCO as described above. The phase detector 162 outputs a first control signal (Upb) 182 having a pulse width corresponding to a first signal received at a first input 184, and a second control signal (Dn) 186 having a pulse width corresponding to a second signal received at a second input 188. The first selector circuit 164 is coupled to a reference signal input node 190, an output 192 of the phase-adjusting circuit 170, and the phase detector 162. The first selector circuit 164 couples a reference signal (Ref) to the first input 184 and selectively couples the reference signal (Ref) and the adjusted signal (Clk) to the second input 188 in accordance with a select signal (Sel).

The charge pump circuit 166 includes a first device (M1) 200, a second device (M2) 202, a third device (M3) 204, a fourth device (M4) 206, a first current source (M5) 208, and a second current source (M6) 210. The first device 200 controls a first current (Iu) 230 flowing from the first current source 208 to a first output node 212 in accordance with the first control signal 182. The first output node 212 is coupled to a first capacitor node 214. The second device 202, controls a second current (Id) 232 flowing from the first output node 212 to the second current source 210 in accordance with the second control signal 186. The third device 204 controls a third current (Iu) 234 flowing from the first current source 208 to a second output node in accordance with the first control signal 182. The second output node 216 is coupled to a second capacitor node 218. The fourth device 206 controls a fourth current (Id) 236 flowing from the second output node 216 to the second current source 210 in accordance with the second control signal 186.

The second selector circuit 168 is coupled between the phase detector 162 and the charge pump circuit 166, and selectively couples the first control signal 182 to the first device 200 or to the third device 204 in accordance with the select signal (Sel). The second selector circuit 168 also selectively couples the second control signal 186 to the second device 202 or to the fourth device 206 in accordance with the select signal (Sel).

The first capacitor (C) 172 is coupled to the first capacitor node 214 which is coupled to the control input 180 of the phase-adjusting circuit 170. The second capacitor 218 is coupled to the second capacitor node 174. The operational amplifier 176 is coupled to the first and second capacitor nodes 214 and 218 and to the charge pump circuit 166. An output signal (Pbias) 177 of the operational amplifier 176 controls the first current source 208.

As shown in FIG. 6, the first and second selector circuits 164 and 168 may use six multiplexers controlled by the select signal (Sel) to switch between its two operating modes. These multiplexers may be implemented into existing buffer or driver stages inside the phase detector 162. The first selector circuit 164 couples the adjusted signal (Clk) to the second input 188 of the phase detector 162 if the select signal (Sel) has a first level, and couples the reference signal (Ref) to the second input 188 if the select signal (Sel) has a second level. The second selector circuit 168 couples the first and second control signals 182 and 186 to the first and second devices 200 and 202, respectively, if the select signal (Sel) has the first level, and couples the first and second control signals 182 and 186 to the third and fourth devices 204 and 206, respectively, if the select signal (Sel) has a second level.

Accordingly, when the selection signal (Sel) has the first level, for example, logic high or bit “1”, the PD-CP set operates as a "primary" PD-CP set, and the phase detector 162 receives the reference signal (Ref) and the adjusted signal (Clk). The charge pump circuit 166 supplies its output current to the loop filter capacitor 172 from the first (primary) output node 212, while keeping the second (dummy) output node 216 in a high-impedance state. The control signal from the first capacitor node 214 controls the phase-adjusting circuit 170.

When the selection signal (Sel) has the second level, for example, logic low or bit "0", the PD-CP set operates as a "dummy" PD-CP set (i.e., the schematic SPO monitor). The phase detector 162 receives the same reference signal (Ref) at the both inputs, and the charge pump circuit 166 supplies the output current from the second output node 216 to the second capacitor 174, while keeping the first output node 212 in a high-impedance state. It should be noted that although current damping paths are provided in order to keep the current in the current sources 208 and 210 flowing all the time, they are not illustrated in FIG. 6 for simplicity. The current dumping paths in the charge pump circuit 166 is turned on only when the both pairs of switch devices are turned off.

FIG. 7 schematically illustrates a circuit 260 for aligning a signal with a reference signal, in accordance with one embodiment of the present invention. The circuit 260 includes a phase-adjusting circuit 262, a first self-calibrating PD-CP set 264, a second self-calibrating PC-CP set 266, an operational amplifier 270, a first capacitor (C) 272, and a second capacitor (C') 274. The circuit 260 also includes a divide-by-two circuit 276, which generates a first selection signal ($Sel_1$) 282 for the first PD-CP set 264 and a second selection signal ($Sel_2$) 284 for the second PD-CP set 266 from the reference signal.

Each of the self-calibrating PD-CP sets 264 and 266 has the same structure as that of the self-calibrating PD-CP set of the circuit 160, and also includes the selector circuits as shown in FIG. 6. Each PD-CP set achieves zero systematic SPO with the first and second capacitors 272 and 274 and the operational amplifier 270 in the same manner as the circuit 50 (FIG. 5). However, in this embodiment, there is no designated "primary" or "dummy" PD-CP set, and each of the two self-calibrating PD-CP sets 264 and 266 drives the first capacitor 272 half of the time and drives the second capacitor 274 the other half of the time. As shown in FIG. 8, the first selection signals ($Sel_1$ and $Sel_2$) which are input to the two sets 264 and 266, respectively, are complementary and toggle at falling edges of the reference signal (Ref). The edges of the selection signals are timing-wise half cycle away from rising edges of the reference signal (Ref) which are used for the DLL phase-detection.

For a particular cycle, one of the self-calibrating PD-CP sets 264 and 266 drives the phase-delay loop (including the first capacitor 272 and the phase adjusting circuit 262), while the other drives the systematic SPO cancellation circuitry (including the second capacitor 274 and the operational amplifier 279). For the next cycle, the two PD-CP sets exchange their roles. The circuit 260 has two advantages over the double DP-double CP DLL for low random SPO. First, since the CP output current of the two operating modes come from the same set of current source devices (M5 and M6 in FIG. 6), random variations in the current sources are completely canceled out by the SPO cancellation circuitry (hence, it is referred to as "self-calibrating"). Second, the remaining random SPO, which is caused only by random variations in current switches and between the two sides of the PD, will be statistically further reduced by a factor of 2. This is due to the averaging effect of operating the two self-calibrating PD-CP sets in an alternating way. The effective SPO of a self-calibrating PD-CP DLL, put in the random variable notations as defined above, is (x1+x2)/2, which has a standard deviation of 0.71σ.

In the circuit 260, the phase detection is conducted once every clock cycle and the two self-calibrating PD-CP 264 and 266 are used alternately for the phase delay loop and for the static phase offset cancellation. If the DLL may perform the phase detection once every two cycles, only one set of self-calibrating PD-CP may be used, as shown in FIG. 6, saving power and area.

In accordance with one embodiment of the present invention, the pump-up current (Iu) source (device 208) may be split into two. In FIG. 5, for example, one of the split current sources is fine-tuned by the operational amplifier 176 as shown. The other is still current-mirrored from the Nbias. This technique helps avoid start-up issues in the charge pump circuit. The same technique is also applicable to the circuit 160 in FIG. 6.

In the previous embodiments, it is assumed that the second bias voltage (Nbias) is set by certain circuitry outside the circuit under consideration, and the first bias voltage (Pbias) is mirrored or tuned by an operational amplifier to track with the second bias voltage (Nbias) as well as other factors to achieve zero SPO. However, the zero SPO can be achieved by setting the first bias voltage (Pbias) separately and the second bias voltage (Nbias) is mirrored or fine-tuned by an operational amplifier. In that case, input polarities of the current-tuning operational amplifiers 140, 176, and 270 in FIGS. 5, 6, 7, respectively, should be inverted.

Although the SPO cancellation techniques in the above-embodiments are described using DLL's, the same techniques can also be applied to phase-lock loop (PLL) designs. Many PLL's are used as frequency synthesizers and may not have the SPO concerns. However, for PLL's that do need SPO controls, the SPO-reducing techniques disclosed in the above embodiments (double-PD double-CP DLL and self-calibrating PD-CP DLL) will work equally well.

As describe above, in accordance with the embodiments of the present invention, the double-PD double CP circuitry or self-calibrating PD-CP circuitry removes all systematic SPO (from the Iu-Id mismatch and polarity inversion) of a DLL with small increases on power and area. It requires no cascading current sources, and thus it is suitable for low power supply voltage designs. It does not depend on the device model accuracy and it works well for all PVT and frequency conditions.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A circuit for aligning a signal with a reference signal, said circuit comprising:

a phase-adjusting circuit for adjusting a phase of a signal in accordance with a control signal received at a control signal input, said phase-adjusting circuit outputting an adjusted signal;

a first control circuit coupled to said phase-adjusting circuit, for outputting a first voltage signal in accordance with a phase difference between a first input signal and a second input signal, said first control circuit receiving a reference signal as the first input signal and the adjusted signal as the second input signal, the first voltage signal also reflecting a static phase offset due to asymmetries in components of said first control circuit;

a second control circuit which is a replica of said first control circuit and has the same static phase offset as said first control circuit, said second control circuit receiving the reference signal as two input signals and outputting a second voltage signal reflecting the same static phase offset; and a tuning circuit coupled to said first and second control circuits, said tuning circuit comparing the first and second voltage signals and tuning a bias current in said first and second control circuits such that the static phase offsets of said first and second control circuits become zero in a steady state.

2. A circuit in accordance with claim 1 wherein said first control circuit includes:

a first phase detector coupled to a reference signal input node and an output of said phase-adjusting circuit, said first phase detector receiving the reference signal and the adjusted signal and outputting a first control signal and a second control signal, the first control signal having a pulse width corresponding to the reference signal, and the second control signal having a pulse width corresponding to the adjusted signal;

a first charge pump circuit coupled to said first phase detector, said first charge pump circuit including a first device controlling a first current flowing from a first current source to a first output node in accordance with the first control signal, the first output node being coupled to a first capacitor node, and a second device controlling a second current flowing from the first output node to a second current source in accordance with the second control signal; and a first capacitor coupled to the first capacitor node, the first capacitor node being also coupled to the control input of said phase-adjusting circuit, the first capacitor providing the first voltage signal.

3. A circuit in accordance with claim 2 wherein said second control circuit includes:

a second phase detector coupled to the reference signal input node, said second phase detector outputting a third control signal having a pulse width corresponding to the reference signal, and a fourth control signal having a pulse width corresponding to the reference signal;

a second charge pump circuit coupled to said second phase detector, said second charge pump circuit including a third device controlling a third current flowing from a third current source to a second output node in accordance with the third control signal, the second output node being coupled to a second capacitor node, and a fourth device controlling a fourth current flowing from the second output node to a fourth current source in accordance with the fourth control signal; and a second capacitor coupled to the second capacitor node, the second capacitor providing the second voltage signal.

4. A circuit in accordance with claim 3 wherein said tuning circuit includes:

an operational amplifier coupled to the first and second capacitor nodes and to said first and second charge pump circuits, an output signal of said operational amplifier controlling said first and third current sources.

5. A circuit in accordance with claim 1 wherein said phase adjusting circuit includes voltage-controlled delay.

6. A circuit in accordance with claim 1 wherein said phase adjusting circuit includes a voltage-controlled oscillator.

7. A circuit for aligning a signal with a reference signal, said circuit comprising:

a phase-adjusting circuit for outputting an adjusted signal in accordance with a control signal supplied at a control input;

a first phase detector coupled to a reference signal input node and an output of said phase-adjusting circuit, said first phase detector receiving a reference signal and the adjusted signal and outputting a first control signal and a second control signal, the first control signal having a pulse width corresponding to the reference signal, and the second control signal having a pulse width corresponding to the adjusted signal;

a first charge pump circuit coupled to said first phase detector, said first charge pump circuit including a first device controlling a first current flowing from a first current source to a first output node in accordance with the first control signal, the first output node being coupled to a first capacitor node, and a second device controlling a second current flowing from the first output node to a second current source in accordance with the second control signal;

a first capacitor coupled to the first capacitor node, the first capacitor node being also coupled to the control input of said phase-adjusting circuit;

a second phase detector coupled to the reference signal input node, said second phase detector outputting a third control signal having a pulse width corresponding to the reference signal, and a fourth control signal having a pulse width corresponding to the reference signal;

a second charge pump circuit coupled to said second phase detector, said second charge pump circuit including a third device controlling a third current flowing from a third current source to a second output node in accordance with the third control signal, the second output node being coupled to a second capacitor node, and a fourth device controlling a fourth current flowing from the second output node to a fourth current source in accordance with the fourth control signal;

a second capacitor coupled to the second capacitor node; and an operational amplifier coupled to the first and second capacitor nodes and to said first and second charge pump circuits, an output signal of said operational amplifier controlling said first and third current sources.

8. A circuit in accordance with claim 7 wherein said phase adjusting circuit includes voltage-controlled delay.

9. A circuit in accordance with claim 7 wherein said phase adjusting circuit includes a voltage-controlled oscillator.

10. A circuit in accordance with claim 7 wherein said first and third devices are PMOSFETs and said second and fourth devices are NMOSFETs.

11. A circuit in accordance with claim 7 wherein the first and third current sources are PMSOFETs controlled by a first bias voltage supplied from said operational amplifier.

12. A circuit in accordance with claim 7 wherein the second and fourth current sources are MMOSFETs controlled by a second bias voltage supplied from a bias node.

13. A circuit in accordance with claim 7 wherein a capacitance of said second capacitor is smaller than a capacitance of said first capacitor.

14. A circuit in accordance with claim 13 wherein the capacitance of said second capacitor is about ¼ of the capacitance of said first capacitor.

15. A circuit for aligning a signal with a reference signal, said circuit comprising:
- a phase-adjusting circuit for outputting an adjusted signal in accordance with a control signal supplied at a control input;
- a phase detector for outputting a first control signal having a pulse width corresponding to a first signal received at a first input, and a second control signal having a pulse width corresponding to a second signal received at a second input;
- a first selector circuit coupled to a reference signal input node, said phase-adjusting circuit, and said phase detector, said first selector circuit coupling a reference signal to the first input and selectively coupling the reference signal and the adjusted signal to the second input in accordance with a select signal;
- a charge pump circuit including
  - a first device controlling a first current flowing from a first current source to a first output node in accordance with the first control signal, the first output node being coupled to a first capacitor node,
  - a second device controlling a second current flowing from the first output node to a second current source in accordance with the second control signal,
  - a third device controlling a third current flowing from the first current source to a second output node in accordance with the first control signal, the second output node being coupled to a second capacitor node, and
  - a fourth device controlling a fourth current flowing from the second output node to the second current source in accordance with the second control signal;
- a second selector circuit coupled between said phase detector and said charge pump circuit, said second selector circuit selectively coupling the first control signal to said first device or to said third device, and selectively coupling the second control signal to said second device or to said fourth device, in accordance with the select signal;
- a first capacitor coupled to the first capacitor node, the first capacitor node being also coupled to the control input of said phase-adjusting circuit;
- a second capacitor coupled to the second capacitor node; and
- an operational amplifier coupled to the first and second capacitor nodes and to said charge pump circuit, an output signal of said operational amplifier controlling the first current source.

16. A circuit in accordance with claim 15 wherein said first selector circuit couples the adjusted signal to the second input if the select signal has a first level, and couples the reference signal to the second input if the select signal has a second level.

17. A circuit in accordance with claim 16 wherein said second selector circuit couples the first and second control signals to said first and second devices, respectively, if the select signal has the first level, and couples the first and second control signals to said third and fourth devices, respectively, if the select signal has a second level.

18. A circuit in accordance with claim 15 wherein said phase adjusting circuit includes voltage-controlled delay.

19. A circuit in accordance with claim 15 wherein said phase adjusting circuit includes a voltage-controlled oscillator.

20. A circuit in accordance with claim 15 wherein said first and third devices are PMOSFETs and said second and fourth devices are NMOSFETs.

21. A circuit in accordance with claim 15 wherein the first current source is a PMSOFET controlled by a first bias voltage supplied from said operational amplifier.

22. A circuit in accordance with claim 15 wherein the second current source is an NMOSFET controlled by a second bias voltage supplied from a bias node.

23. A circuit in accordance with claim 15 wherein a capacitance of said second capacitor is smaller than a capacitance of said first capacitor.

24. A circuit in accordance with claim 23 wherein the capacitance of said second capacitor is about ¼ of the capacitance of said first capacitor.

25. A circuit for aligning a signal with a reference signal, said circuit comprising:
- a phase-adjusting circuit for outputting an adjusted signal in accordance with a control signal supplied at a control input;
- a first circuit including:
  - a first phase detector for outputting a first control signal having a pulse width corresponding to a first signal received at a first input, and a second control signal having a pulse width corresponding to a second signal received at a second input;
  - a first selector circuit coupled to a reference signal input node, said phase-adjusting circuit, and said first phase detector, said first selector circuit coupling a reference signal to the first input and selectively coupling the reference signal and the adjusted signal to the second input in accordance with a first select signal;
  - a first charge pump circuit including
    - a first device controlling a first current flowing from a first current source to a first output node in accordance with the first control signal, the first output node being coupled to a first capacitor node,
    - a second device controlling a second current flowing from the first output node to a second current source in accordance with the second control signal,
    - a third device controlling a third current flowing from the first current source to a second output node in accordance with the first control signal, the second output node being coupled to a second capacitor node, and
    - a fourth device controlling a fourth current flowing from the second output node to the second current source in accordance with the second control signal; and
  - a second selector circuit coupled between said phase detector and said first charge pump circuit, said second selector circuit selectively coupling the first control signal to said first device or said third device, and selectively coupling the second control signal to said second device or said fourth device, in accordance with the first select signal;
- a second circuit including:
  - a second phase detector for outputting a third control signal having a pulse width corresponding to a third signal received at a third input, and a fourth control signal having a pulse width corresponding to a fourth signal received at a fourth input;

a third selector circuit coupled to said second phase detector, said third selector circuit coupling the reference signal to the third input and selectively coupling the reference signal and the adjusted signal to the fourth input in accordance with a second select signal;

a second charge pump circuit including a fifth device controlling a fifth current flowing from a third current source to a third output node in accordance with the third control signal, the third output node being coupled to the first capacitor node, a sixth device controlling a sixth current flowing from the third output node to a fourth current source in accordance with the fourth control signal, a seventh device controlling a seventh current flowing from the third current source to a fourth output node in accordance with the third control signal, the fourth output node being coupled to the second capacitor node, and a eighth device controlling a eighth current flowing from the fourth output node to the fourth current source in accordance with the fourth control signal; and a fourth selector circuit coupled between said second phase detector and said fifth, sixth, seventh, and eighth devices, said fourth selector circuit selectively coupling, in accordance with the second select signal, the third control signal to said fifth and sixth devices, and the fourth control signal to said seventh and eighth devices;

a first capacitor coupled to the first capacitor node, the first capacitor node being also coupled to a control input of said phase-adjusting circuit;

a second capacitor coupled to the second capacitor node;

an operational amplifier coupled to the first and second capacitor nodes and to said first and second charge pump circuits, an output of said operational amplifier controlling the first and third current sources; and a select signal control circuit coupled to said first and second circuits, said select signal control circuit supplying the first and second select signals to said first and second circuits, the first and second select signals being complementary each other.

26. A circuit in accordance with claim 25 wherein said first selector circuit couples the adjusted signal to the second input if the first select signal has a first level, and couples the reference signal to the second input if the first select signal has a second level.

27. A circuit in accordance with claim 26 wherein said second selector circuit couples the first and second control signals to said first and second devices, respectively, if the first select signal has the first level, and couples the first and second control signals to said third and fourth devices, respectively, if the first select signal has a second level.

28. A circuit in accordance with claim 27 wherein said third selector circuit couples the adjusted signal to the third input if the second select signal has a first level, and couples the reference signal to the fourth input if the second select signal has a second level.

29. A circuit in accordance with claim 28 wherein said fourth selector circuit couples the third and fourth control signals to said fifth and sixth devices, respectively, if the second select signal has the first level, and couples the third and fourth control signals to said seventh and eighth devices, respectively, if the second select signal has a second level.

30. A circuit in accordance with claim 25 wherein said select signal control circuit includes:

a divided-by-two circuit coupled the reference signal input node, said divided-by-two circuit generating the first and second select signals based on the reference signal.

* * * * *